United States Patent
Hsing et al.

(10) Patent No.: US 11,118,850 B2
(45) Date of Patent: Sep. 14, 2021

(54) THERMAL ABNORMALITY DETECTION SYSTEM AND METHOD

(71) Applicant: Delta Electronics, Inc., Taoyuan (TW)

(72) Inventors: Lei-Chung Hsing, Taoyuan (TW); Hsien-Chih Ou, Taoyuan (TW); Chun-Chang Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 389 days.

(21) Appl. No.: 16/185,428

(22) Filed: Nov. 9, 2018

(65) Prior Publication Data

US 2019/0316855 A1 Oct. 17, 2019

(30) Foreign Application Priority Data

Apr. 13, 2018 (TW) .................................. 107112725

(51) Int. Cl.
*G01R 27/28* (2006.01)
*G01R 31/08* (2020.01)
(Continued)

(52) U.S. Cl.
CPC ............. *F28F 27/00* (2013.01); *G05D 23/00* (2013.01); *G01R 27/04* (2013.01); *G01R 27/28* (2013.01);
(Continued)

(58) Field of Classification Search
CPC .................................. F28F 27/00; G05D 23/00
(Continued)

(56) References Cited

U.S. PATENT DOCUMENTS

| 5,969,927 A * | 10/1999 | Schirmer ............ H01L 27/0248 361/103 |
| 2002/0140389 A1* | 10/2002 | Ohki ...................... G06F 1/206 318/471 |

(Continued)

FOREIGN PATENT DOCUMENTS

| JP | S58208650 A | 12/1983 |
| JP | 2003262220 A | 9/2003 |

OTHER PUBLICATIONS

Office Action dated Jan. 28, 2020 in JP Application No. 2019-003269.

*Primary Examiner* — Ly D Pham
(74) *Attorney, Agent, or Firm* — Muncy, Geissler, Olds & Lowe, P.C.

(57) ABSTRACT

A thermal abnormality detection system includes: a first heat dissipation system having a first temperature sensor for measuring an actual temperature of the first heat dissipation system; a second heat dissipation system having a second temperature sensor for measuring an actual temperature of the second heat dissipation system. Assuming that a difference between the actual temperature of the first heat dissipation system and an upper limit temperature of the first heat dissipation system is d1, and a difference between the actual temperature of the second heat dissipation system and an upper limit temperature of the second heat dissipation system is d2, when a value of d1−d2 is greater than an error threshold value Error1_level, the first heat dissipation system is determined to be abnormal, and when the value of d1−d2 is less than an error threshold value Error2_level, the second heat dissipation system is determined to be abnormal.

17 Claims, 5 Drawing Sheets

(51) Int. Cl.
*G01R 31/11* (2006.01)
*G01R 31/00* (2006.01)
*F28F 27/00* (2006.01)
*G05D 23/00* (2006.01)
*G01R 27/04* (2006.01)
*G01R 31/28* (2006.01)
*G01R 27/32* (2006.01)
*G01R 31/317* (2006.01)

(52) U.S. Cl.
CPC ............ *G01R 27/32* (2013.01); *G01R 31/086* (2013.01); *G01R 31/11* (2013.01); *G01R 31/2822* (2013.01); *G01R 31/2836* (2013.01); *G01R 31/31717* (2013.01)

(58) Field of Classification Search
USPC .......................................................... 702/59
See application file for complete search history.

(56) References Cited

U.S. PATENT DOCUMENTS

| | | | | |
|---|---|---|---|---|
| 2003/0216882 | A1* | 11/2003 | Lai | H05K 7/20209 |
| | | | | 702/132 |
| 2013/0200856 | A1* | 8/2013 | Zhang | B60L 3/12 |
| | | | | 320/150 |
| 2015/0096715 | A1* | 4/2015 | Lin | H05K 7/20836 |
| | | | | 165/11.1 |
| 2015/0114616 | A1* | 4/2015 | Lin | H05K 7/20781 |
| | | | | 165/287 |
| 2016/0272036 | A1* | 9/2016 | Chen | B32B 7/05 |
| 2016/0356655 | A1* | 12/2016 | Tsurumaru | H01L 29/7395 |

\* cited by examiner

THERMAL ABNORMALITY DETECTION SYSTEM AND METHOD

CROSS REFERENCE TO RELATED APPLICATIONS

This application claims priority of Taiwan Patent Application No. 107112725, filed on Apr. 13, 2018, the entirety of which is incorporated by reference herein.

BACKGROUND OF THE INVENTION

Field of the Invention

The invention relates to thermal abnormality detection, and in particular to a thermal abnormality detection system and a detection method thereof for determining heat dissipation abnormality with a simple configuration to reduce costs.

Description of the Related Art

When a device or a machine is divided into multiple heat dissipation systems, here taking two heat dissipation systems as an example, temperature sensors are set on each of the two systems to detect actual temperatures of each of the two heat dissipation systems. When the device or machine is operating normally, the detected temperature is affected by factors such as heating transferred by load components, ambient temperature, and heat dissipation conditions, and there is a specific sensed temperature value. The actual temperatures of the two systems sensed are mainly used to determine whether the internal heat of the first heat dissipation system and the second heat dissipation system are abnormal or not. When a pre-set protection temperature value is exceeded, it is determined that the first heat dissipation system or the second heat dissipation system is abnormal.

Generally, the method of determining whether the heat dissipation system is abnormal is to assess in advance the first heat dissipation system or the second heat dissipation system under extreme ambient temperature, extreme load, or extreme heat conditions, and to calculate a temperature difference between the component temperature limit and the reference point in real time using experimentation, a formula, or a thermal network model. The temperature difference is used to derive the limit temperature of the sensing point where the temperature sensor is disposed. This limit temperature can be set to the above protection temperature value.

However, the disadvantage of this method is that it can only protect from extreme states, and it cannot know the thermal abnormality under a relative low-temperature state or a high-temperature light load state. In order to solve this problem, the usual method has been to add additional protection conditions. For example, an additional temperature sensor is added at the ambient temperature location to sense a reference temperature, and the difference between the actual temperature of the first heat dissipation system and the reference temperature, the difference between the actual temperature of the second heat dissipation system and the reference temperature, and the current load are used to determine whether the temperature of the heat dissipation systems are abnormal. Although this method corrects the above shortcomings, adding a temperature sensor and its wiring costs more and increases the complexity of the system configuration.

Assuming that the heat dissipation system includes main heat-dissipating components such as a fan and a cooling device, a feedback signal is usually required to confirm whether the operation of the heat-dissipating components is normal. In addition to the high cost of the heat-dissipating components capable of providing feedback signals, it is also necessary to increase the signal detection circuit. Therefore, assuming that two heat dissipation systems use a total of three fans for heat dissipation, a one-to-one configuration is required to detect whether an individual fan has a problem. Namely, three fans with signal feedback function are needed, and three sets of corresponding signal detection circuits are needed to obtain feedback signals.

Therefore, in order to solve the above problems, the purpose of the present invention is to propose a system and method capable of determining whether a heat dissipation system is abnormal using low-cost components and a relatively simple configuration.

BRIEF SUMMARY OF THE INVENTION

A detailed description is given in the following embodiments with reference to the accompanying drawings.

The invention provides a thermal abnormality detection system including: a first heat dissipation system, a second heat dissipation system, and a calculation unit. The first heat dissipation system has a first temperature sensor for measuring an actual temperature of the first heat dissipation system. The second heat dissipation system has a second temperature sensor for measuring an actual temperature of the second heat dissipation system. The calculation unit uses a preset reference temperature and a first estimated temperature calculation formula that conforms to the first heat dissipation system to calculate an upper limit temperature of the first heat dissipation system, and uses the preset reference temperature and a second estimated temperature calculation formula that conforms to the second heat dissipation system to calculate an upper limit temperature of the second heat dissipation system. It is assumed that a difference between the actual temperature of the first heat dissipation system and the upper limit temperature of the first heat dissipation system is d1, and a difference between the actual temperature of the second heat dissipation system and the upper limit temperature of the second heat dissipation system is d2, and when a value of d1−d2 is greater than an error threshold value Error1_level, the first heat dissipation system is determined to be abnormal, and when the value of d1−d2 is less than an error threshold value Error2_level, the second heat dissipation system is determined to be abnormal.

In the thermal abnormality detection system, when d1 is greater than 0, it indicates that the first heat dissipation system is abnormal or both the first heat dissipation system and the second heat dissipation system are abnormal; when d2 is greater than 0, it indicates that the second heat dissipation system is abnormal or both the first heat dissipation system and the second heat dissipation system are abnormal; and when both d1 and d2 are less than or equal to 0, it indicates that the first heat dissipation system and the second heat dissipation system are normal.

In the thermal abnormality detection system, both Error1_level and Error2_level are 0.

In the thermal abnormality detection system, Error1_level is a positive fixed value, and Error2_level is a negative fixed value.

In the thermal abnormality detection system, Error1_level is a positive variation value corresponding to the load, and Error1_level is a negative variation value corresponding to the load.

The thermal abnormality detection system further includes: a memory unit for storing the reference temperature, the first estimated temperature calculation formula, the second estimated temperature calculation formula, the error threshold value Error1_level, and the error threshold value Error2_level.

The invention also provides a thermal abnormality detection method for determining whether a first heat dissipation system or a second heat dissipation system is abnormal. The method includes steps of: measuring an actual temperature of the first heat dissipation system; measuring an actual temperature of the second heat dissipation system; setting a reference temperature; substituting the reference temperature into a first estimated temperature calculation formula that conforms to the first heat dissipation system to calculate an upper limit temperature of the first heat dissipation system; substituting the reference temperature into a second estimated temperature calculation formula that conforms to the second heat dissipation system to calculate an upper limit temperature of the second heat dissipation system; setting an error threshold value Error1_level of the first heat dissipation system; setting an error threshold value Error2_level of the second heat dissipation system; and assuming that a difference between the actual temperature of the first heat dissipation system and the upper limit temperature of the first heat dissipation system is d1, and a difference between the actual temperature of the second heat dissipation system and the upper limit temperature of the second heat dissipation system is d2, when a value of d1−d2 is greater than the error threshold value Error1_level, the first heat dissipation system is determined to be abnormal, and when the value of d1−d2 is less than the error threshold value Error2_level, the second heat dissipation system is determined to be abnormal.

The thermal abnormality detection method further includes steps of: when d1 is greater than 0, determining that the first heat dissipation system is abnormal or both the first heat dissipation system and the second heat dissipation system are abnormal; when d2 is greater than 0, determining that the second heat dissipation system is abnormal or both the first heat dissipation system and the second heat dissipation system are abnormal; and when both d1 and d2 are less than or equal to 0, determining that the first heat dissipation system and the second heat dissipation system are normal.

In the thermal abnormality detection method, both Error1_level and Error2_level are 0.

In the thermal abnormality detection method, Error1_level is a positive fixed value, and Error2_level is a negative fixed value.

In the thermal abnormality detection method, Error1_level is a positive variation value corresponding to the load, and Error1_level2 is a negative variation value corresponding to the load.

According to each embodiment, the invention provides a thermal abnormality detection system and method capable of determining whether a heat dissipation system is abnormal using low-cost components and a relatively simple configuration

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following description provides many different embodiments, or examples, for implementing different features of the disclosure. Elements and arrangements described in the specific examples below are merely used for the purpose of concisely describing the present invention and are merely examples, which are not intended to limit the present invention.

The terms "first" and "second" of this specification are used only for the purpose of clear explanation and are not intended to limit the scope of the patent. In addition, terms such as "the first feature" and "the second feature" are not limited to the same or different features.

Figure 1:
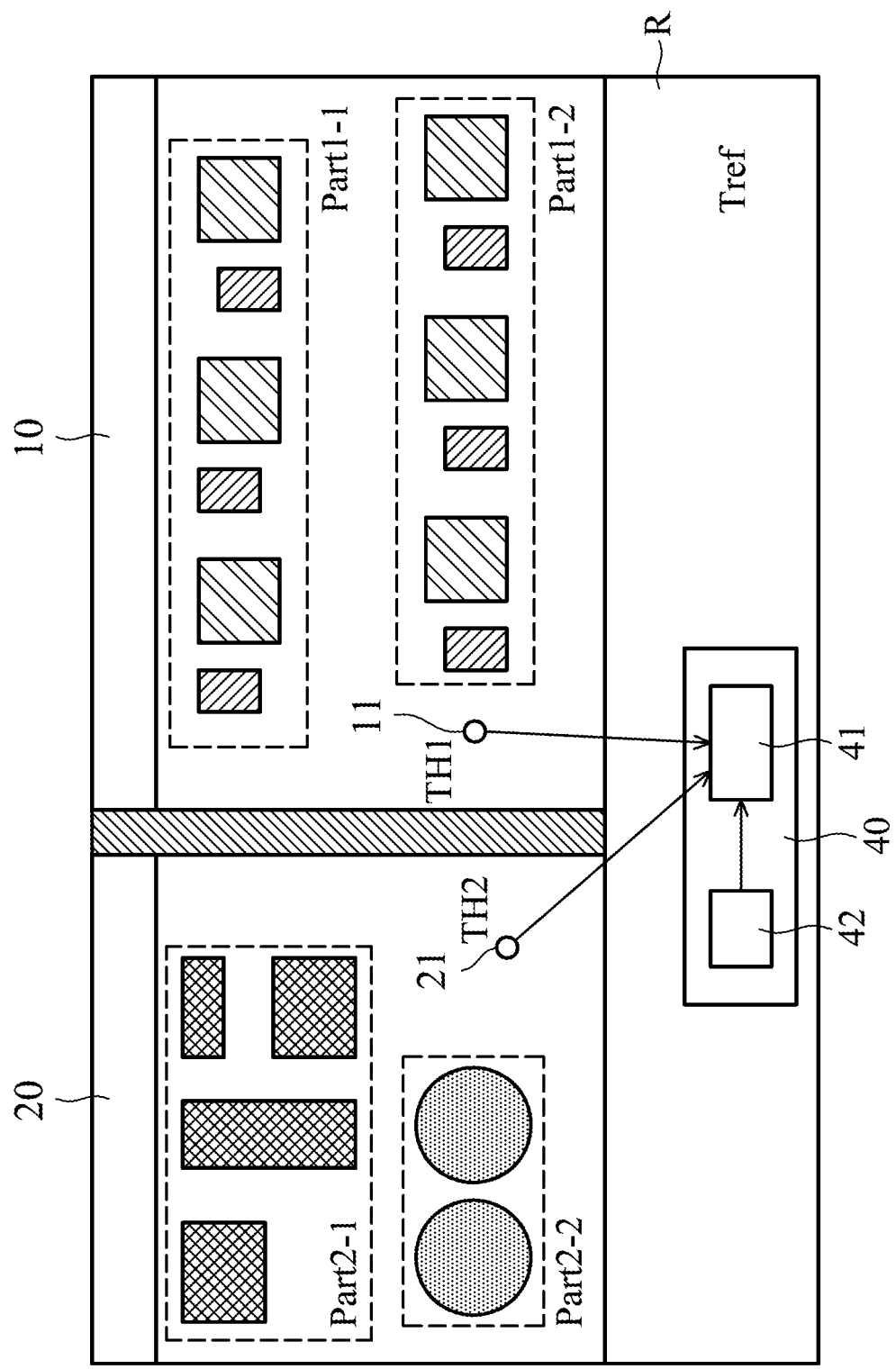
FIG. 1 is a schematic diagram of a thermal abnormality detection architecture of two heat dissipation systems according to an embodiment of the present invention.

The following describes thermal abnormality detection of the present invention by taking two heat dissipation systems as an example. FIG. 1 is a schematic diagram of a thermal abnormality detection architecture of two heat dissipation systems according to an embodiment of the present invention. As shown in FIG. 1, a machine or device includes two heat dissipation systems 10 and 20. The heat dissipation system 10 has parts Part1-1 and Part1-2, and a first temperature sensor 11 is provided to measure the actual temperature TH1 in the heat dissipation system 10. At least one of the parts Part1-1 and Part1-2 may be a heat source. The heat dissipation system 20 has parts Part2-1 and Part2-2, and a second temperature sensor 21 is provided to measure the actual temperature TH2 in the heat dissipation system 20. At least one of the parts Part2-1 and Part2-2 may be a heat source. Outside the heat dissipation systems 10, 20 is an external environment R with a reference temperature Tref that can be used as a reference value. In addition, a thermal abnormality detection circuit 40 is further disposed in the external environment R, and includes an operation unit 41 and a memory unit 42. The present invention does not need further to set a temperature sensor in the external environment R to measure the reference temperature Tref, so the present invention will determine whether the heat dissipation systems 10, 20 are abnormal in the condition where only the actual temperature TH1 and the actual temperature TH2 can be measured, so as to simplify the component configuration and reduce the costs.

In FIG. 1, the actual temperature TH1 of the heat dissipation system 10 is assumed to be affected by the parts Part1-1, Part1-2, the reference temperature Tref, and the heat dissipation conditions of the heat dissipation system 10 itself. The actual temperature TH2 is assumed to be affected by the parts Part 2-1, Part2-2, the reference temperature Tref, and the heat dissipation conditions of the heat dissipation system 20 itself. In theory, the two heat dissipation systems 10 and 20 can be well thermally insulated from each other. Of course, if the systems do interact with each other, the effects of mutual influence need to be taken into account in the temperature assessment model. Herein, the present invention is explained by assuming the effect between the temperatures of the two systems 10, 20 is negligible. The memory unit 42 pre-stores estimated temperature calculation formulas that conform to the heat dissipation system 10 and the heat dissipation system 20 as follows:

$$TH1\_cal = Tref + dT_{th1\text{-}ref}(Tref) \qquad (1)$$

$$TH2\_cal = Tref + dT_{th2\text{-}ref}(Tref) \qquad (2)$$

The formula (1) is an estimated temperature calculation formula of the heat dissipation system 10, and the formula (2) is an estimated temperature calculation formula of the heat dissipation system 20. TH1_cal is an estimated temperature of the heat dissipation system 10, and TH2_cal is an estimated temperature of the heat dissipation system 20. dTth1-ref(Tref) is a function of the reference temperature Tref, within the consideration of the parts Part1-1, Part1-2, the reference temperature Tref, the heat dissipation condition of the heat dissipation system 10, and the like, and dTth2-ref(Tref) is a function of the reference temperature Tref, within the consideration of the parts Part2-1, Part2-2, the reference temperature Tref, the heat dissipation condition of the heat dissipation system 20, and the like.

Since the present invention does not use redundant temperature sensors, the value of Tref is unknown basically; by the way, the variation of $d_{Tth1\text{-}ref}(Tref)$ and $d_{Tth2\text{-}ref}(Tref)$ of formulas (1) and (2) is relative small within the range of the possible reference temperature Tref which is in a reasonable range under an upper limit value Tref_limit, and duplicated operators Tref both in formulas (1) and (2) will be cancelled when formulas (1) and (2) are subtracted mutually. Therefore, in order to simplify the estimated temperature calculation formula, the present invention will find an upper limit value Tref_limit according to the product specification. The upper limit value Tref_limit is substituted into the variables of the reference temperature Tref in the $d_{Tth1\text{-}ref}(Tref)$ and $d_{Tth2\text{-}ref}(Tref)$ functions of formulas (1) and (2) respectively, and two fixed values $d_{Tth1\text{-}ref\_limit}$ and $d_{Tth2\text{-}ref\_limit}$ are respectively obtained. These two fixed values $d_{Tth1\text{-}ref\_limit}$ and $d_{Tth2\text{-}ref\_limit}$ are used instead of the functions $d_{Tth1\text{-}ref}(Tref)$ and $d_{Tth2\text{-}ref}(Tref)$ in the estimated temperature calculation formulas, respectively. Therefore, the estimated temperature calculation formulas can be substituted into the following:

$$TH1\_cal = Tref + dT_{th1\text{-}ref\_limit} \qquad (3)$$

$$TH2\_cal = Tref + dT_{th2\text{-}ref\_limit} \qquad (4)$$

The above-described estimated temperature calculation formulas (3) and (4) are here transformed by the calculation formula of the thermal network model, but may also be any combination or variation of such as a heat flow equation or a fitting equation of an experimental result. Through the temperature calculation formula and the reference temperature Tref, the estimated temperatures of the heat dissipation systems 10 and 20 can be known respectively. When the heat dissipation system 10 is operating normally, the actual temperature TH1 will be equal to the estimated temperature TH1_cal, so the difference dTH1 between them should be 0 or approach 0. Similarly, when the heat dissipation system 20 is operating normally, the actual temperature TH2 will be equal to the estimated temperature TH2_cal, so the difference dTH2 between them should be 0 or approach 0. Assuming that there is an abnormality. For example, if the heat dissipation system 10 is operating abnormally (for example, the temperature TH1 is too high), dTH1>0, or if the heat dissipation system 20 is operating abnormally (for example, the temperature TH2 is too high), dTH2>0. When the formulas (3) and (4) are substituted into dTH1 and dTH2, the following is obtained:

$$dTH1 = TH1 - TH1\_cal = TH1 - (Tref + dT_{th1\text{-}ref\_limit}) \qquad (5)$$

$$dTH2 = TH2 - TH2\_cal = TH2 - (Tref + dT_{th1\text{-}ref\_limit}) \qquad (6)$$

However, without knowing the reference temperature Tref, the values of dTH1 and dTH2 cannot be obtained separately. Therefore, the present invention further defines a judgment formula that subtracts the above formulas (5) and (6) to obtain a value: dTH1−dTH2. The judgment formula is used to eliminate the unknown reference temperature Tref:

$$dTH1 - dTH2 = TH1 - dT_{th1\text{-}ref\_limit} - (TH2 - dT_{th2\text{-}ref\_limit}) \qquad (7)$$

As shown in formula (7) above, the parameters required to calculate dTH1−dTH2 can all be obtained from known sensed values or defined values, and the value of dTH1−dTH2 can be found without actually sensing or defining the reference temperature Tref. Therefore, if the temperatures of the heat dissipation systems 10 and 20 are normal, i.e., dTH1=0 and dTH2=0, so the result of the judgment formula (7) is obtained as dTH1−dTH2=0. Therefore, according to the above formula (7), if the heat dissipation system 10 is abnormal and the heat dissipation system 20 is normal, then dTH1>0 and dTH2=0, so the result of the judgment formula (7) is dTH1−dTH2>0; otherwise, if the heat dissipation system 10 is normal and the heat dissipation system 20 is abnormal, then dTH1=0 and dTH2>0, so the result of the judgment formula (7) is dTH1−dTH2<0.

Figure 2:
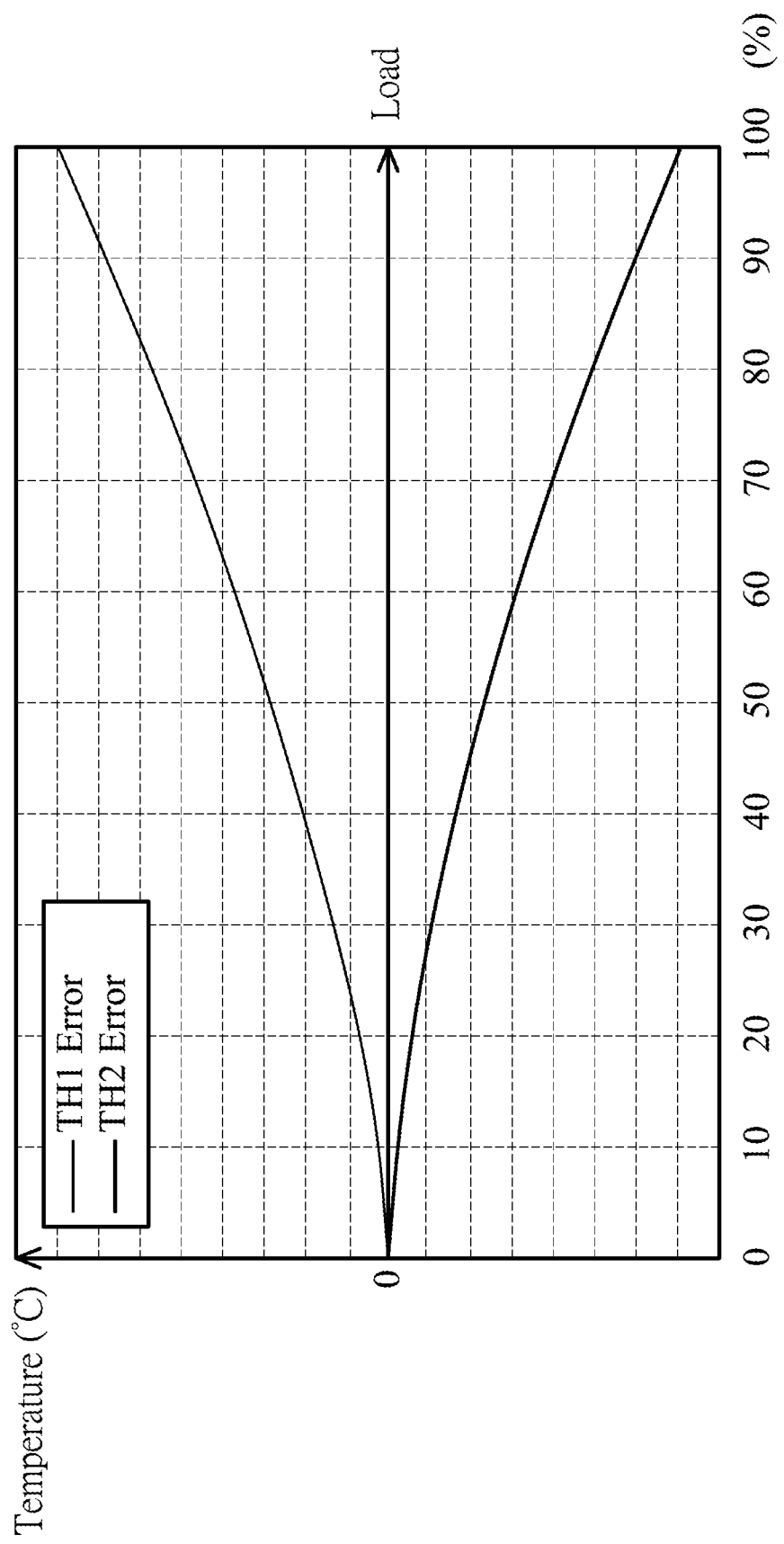
FIG. 2 is a graph illustrating a relationship between a thermal abnormality determination value and a system load according to an embodiment of the present invention.

FIG. 2 is a graph illustrating a relationship between a thermal abnormality determination value and a system load according to an embodiment of the present invention. When at least any one of the heat dissipation systems 10 and 20 shown in FIG. 1 is abnormal, the actual temperature of the total system will be much higher than the estimated value as the load increases. Therefore, the relationship between the value of the above judgment formula (7) and the load will be shown as in FIG. 2. The load (LOAD) is not limited to a single variable, but can also be multivariable, which is often related to the loss. If the condition of load is multivariable, FIG. 2 will become a polysurface. If the heat dissipation system 10 is abnormal, the value of the judgment formula (7) where dTH1−dTH2 is a positive value, TH1 Error, and increases in the positive direction as the load increases. In other way, if the heat dissipation system 20 is abnormal, the judgment formula (7) where dTH1−dTH2 is a negative value, TH2 Error, and increases in the negative direction as the load increases.

Therefore, by using the estimated temperature calculation formula, two temperature sensors and this judgment formula (7), it can be judged easily and instantly whether the two systems are abnormal, without the need for additional temperature sensors to sense the reference temperature Tref. The use of heat-dissipating components that incorporate a feedback circuit such as fans and cooling systems isn't required, either. Therefore, the present invention can simplify the component configuration and significantly reduce the cost.

For the above explanation, here will discuss it further. If it happens that the heat dissipation components of both heat dissipation systems 10 and 20 fail, that is, dTH1>0 and dTH2>0, then the result value of dTH1−dTH2 of the judgment formula (7) may be positive, negative, or 0 because of the different reaction times of the respective systems. The above formula may not be able to determine which system is abnormal. In this case, the above reference temperature upper limit value Tref_limit can be used. This threshold value represents the highest reference temperature that the two systems can tolerate. The reference temperature upper limit Tref_limit is substituted into the estimated temperature calculation formulas (1) and (2) to calculate the estimated temperatures of the heat dissipation system 10 and the heat dissipation system 20 respectively. It is defined that in the reference temperature upper limit value Tref_limit, the estimated temperature of the heat dissipation system 10 is the upper limit temperature TH1_cal_limit, and the estimated temperature of the heat dissipation system 20 is the upper limit temperature TH2_cal_limit. The upper limit temperatures of the heat dissipation systems 10 and 20 are as follows:

$$TH1\_cal\_limit = Tref\_limit + dT_{th1-ref\_limit} \quad (8)$$

$$TH2\_cal\_limit = Tref\_limit + dT_{th2-ref\_limit} \quad (9)$$

When both the heat dissipation system 10 and the heat dissipation system 20 are abnormal, the actual temperature TH1 and the TH2 thereof are simultaneously increased, and it cannot be judged from the value of dTH1−dTH2 of the judgment formula (7) which heat dissipation system is abnormal. In this situation, it can be changed to determine whether the actual temperature exceeds the upper limit temperature calculated by the estimated temperature calculation formula. If the actual temperature exceeds the upper limit temperature, it means that the temperature of one heat dissipation system is too high or the temperatures of both heat dissipation systems are too high. In other words, one heat dissipation system is abnormal, or both heat dissipation systems are abnormal. Therefore, TH1>TH1_cal_limt indicates that the heat dissipation system 10 is abnormal or both the heat dissipation systems 10 and 20 are abnormal. Similarly, TH2>TH2_cal_limt indicates that the heat dissipation system 20 is abnormal or both the heat dissipation systems 10 and 20 are abnormal.

Therefore, for the two heat dissipation systems 10 and 20, the present invention can propose the following four judgment formulas (a)-(d) to judge which heat dissipation system has abnormal conditions. When the formula (a) is satisfied, the heat dissipation system 10 is abnormal; when the formula (b) is satisfied, the heat dissipation system 20 is abnormal; when the formula (c) is satisfied, the heat dissipation system 10 is abnormal or both the heat dissipation systems 10 and 20 are abnormal; when the formula (d) is satisfied, the heat dissipation system 20 is abnormal or both the heat dissipation systems 10 and 20 are abnormal; and if neither formula (a)-(d) is satisfied, it is determined that the two heat dissipation systems 10 and 20 are normal.

$$dTH1 - dTH2 > 0 \quad (a)$$

$$dTH1 - dTH2 < 0 \quad (b)$$

$$TH1 > TH1\_cal\_limt \quad (c)$$

$$TH2 > TH2\_cal\_limt \quad (d)$$

In addition, from the above equations (7)-(9), the judgment formula can be further corrected to the following:

$$\begin{aligned}dTH1 - dTH2 &= TH1 - dT_{th1-ref\_limit} - (TH2 - dT_{th2-ref\_limit}) \\ &= TH1 - (Tref\_limit + dT_{th1-ref\_limit}) - \\ &\quad [TH2 - (Tref\_limit + dT_{th2-ref\_limit})] \\ &= (TH1 - TH1\_cal\_limit) - (TH2 - TH2\_cal\_limit) \\ &= d1 - d2\end{aligned} \quad (10)$$

That is, d1 is defined as the difference between the actual temperature TH1 of the heat dissipation system 10 minus the upper limit temperature TH1_cal_limit of the heat dissipation system 10, and d2 is defined as the difference between the actual temperature TH2 of the heat dissipation system 20 and the upper limit temperature TH2_cal_limit of the heat dissipation system 20. In this case, the difference dTH1−dTH2 calculated by the judgment formula (7) is actually equivalent to the difference d1−d2 calculated by formula (10).

The above four judging formulas (a)-(d) can be further simplified to the following: When the formula (a') is satisfied, the heat dissipation system 10 is abnormal; when the formula (b') is satisfied, the heat dissipation system 20 is abnormal; when the formula (c') is satisfied, the heat dissipation system 10 is abnormal or both the heat dissipation systems 10 and 20 are abnormal; when the formula (d') is satisfied, the heat dissipation system 20 is abnormal or both the heat dissipation systems 10 and 20 are abnormal; and if neither formula (a')-(d') is satisfied, it is determined that the two heat dissipation systems 10 and 20 are normal.

$$d1 - d2 > 0 \quad (a')$$

$$d1 - d2 < 0 \quad (b')$$

$$d1 > 0 \quad (c')$$

$$d2 > 0 \quad (d')$$

With the above judgment formula group (a)-(d) or group (a')-(d'), it is not necessary to add a temperature sensor for sensing the reference temperature Tref. and a heat dissipation abnormality determination function of multiple heat dissipation systems can be achieved. In addition, it is not necessary to provide a heat dissipating component having a feedback signal function. Therefore, it is possible to simplify the component configuration and significantly reduce the cost.

Figure 3:
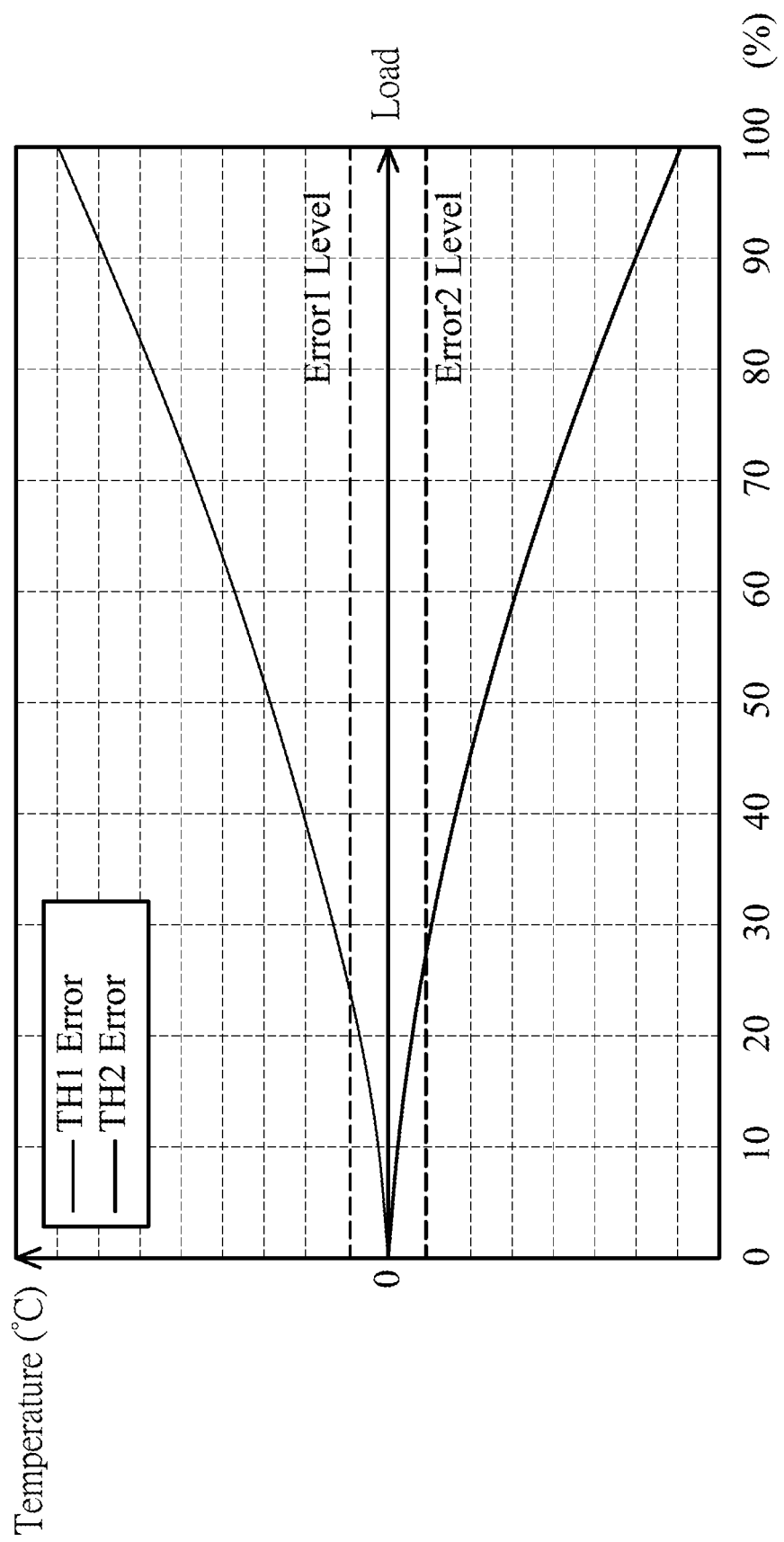
FIG. 3 is a graph illustrating a relationship between a thermal abnormality determination value and a system load, together with a constant error threshold value according to another embodiment of the present invention.

Next, another embodiment of the present invention will be described. FIG. 3 is a graph illustrating a relationship between a thermal abnormality determination value and a system load, together with a constant error threshold value according to another embodiment of the present invention. Considering that the model represented by the estimated temperature calculation formula in actual application has an error with the actual temperature, an error threshold value Error1_Level is set for the heat dissipation system 10, and an error threshold value Error2_Level is set for the heat dissipation system 20, wherein Error1_Level>0 and Error2_Level<0. In this embodiment, both of the error threshold values are set to a fixed value. As shown in FIG. 3, the load (LOAD) is not limited to a single variable, but can also be multivariable, which is often related to the loss. If the condition of load is multivariable, FIG. 3 will become a polysurface.

When the heat dissipation system 10 is abnormal, dTH1−dTH2 calculated by the judgment formula (7) will be represented by the curve, TH1 Error. When the heat dissipation system 20 is abnormal, dTH1−dTH2 calculated by the judgment formula (7) will be represented by the curve, TH2 Error. When the heat dissipation system 10 is under a high load and the curve TH1 Error is higher than Error1_Level, it is determined that the heat dissipation system 10 is abnormal. Similarly, when the heat dissipation system 20 is under a high load and the curve TH2 Error is lower than Error2_Level, it is determined that the heat dissipation system 20 is abnormal. The purpose of this setting is to consider the actual existence of errors, to avoid overestimating or underestimating specific parameters, and to increase the accuracy of the judgment and fault tolerance.

The main advantage of using this error threshold value is that it can reduce the complexity of the temperature calculation model. When the system is large or complex, the temperature calculation model becomes very complicated. The establishment of an accurate temperature calculation model requires a huge amount of calculations, experiments, or complicated formulas, and it is difficult to apply them to real-time computing. With the simplified temperature calculation model, there will be errors, but it can be applied to real-time computing on machines. The influence of this error setting is mainly due to the fact that it is impossible to detect the thermal abnormality in the light load state, but it is also consistent with the general usage. In a light load state, regardless of whether the heat dissipation system is abnormal, it still can be used in theory. However, when the load is high or the temperature is high, it is more necessary to detect whether the heat dissipation system is abnormal and then protect the heat dissipation system. In many applications, a heat dissipation component such as a fan is operated at a low speed or in a non-operating state at a light load condition, and is operated at a full speed until a high temperature or a high load condition, so that the above settings can achieve a more efficient system protection effect.

Therefore, for this embodiment, the above judgment formula group (a)-(d) can be rewritten as follows: When the formula (e) is satisfied, the heat dissipation system 10 is abnormal; when the formula (f) is satisfied, the heat dissipation system 20 is abnormal; when the formula (g) is satisfied, the heat dissipation system 10 is abnormal or both the heat dissipation systems 10 and 20 are abnormal; when the formula (h) is satisfied, the heat dissipation system 20 is abnormal or both the heat dissipation systems 10 and 20 are abnormal; and if neither formula (e)-(h) is satisfied, it is determined that the two heat dissipation systems 10 and 20 are normal.

$$dTH1-dTH2 > \text{Error1\_Level} \tag{e}$$

$$dTH1-dTH2 < \text{Error2\_Level} \tag{f}$$

$$TH1 > TH1\_cal\_\text{limt} \tag{g}$$

$$TH2 > TH2\_cal\_\text{limt} \tag{h}$$

Similarly, the above four judgment formulas (e)-(h) can be further simplified as follows by the above formula (10): When the formula (e') is satisfied, the heat dissipation system 10 is abnormal; when the formula (f') is satisfied, the heat dissipation system 20 is abnormal; when the formula (g') is satisfied, the heat dissipation system 10 is abnormal or both the heat dissipation systems 10 and 20 are abnormal; when the formula (h') is satisfied, the heat dissipation system 20 is abnormal or both the heat dissipation systems 10 and 20 are abnormal; and if neither formula (e')-(h') is satisfied, it is determined that the two heat dissipation systems 10 and 20 are normal.

$$d1-d2 > \text{Error1\_Level} \tag{e'}$$

$$d1-d2 < \text{Error2\_Level} \tag{f'}$$

$$d1 > 0 \tag{g'}$$

$$d2 > 0 \tag{h'}$$

Figure 4:
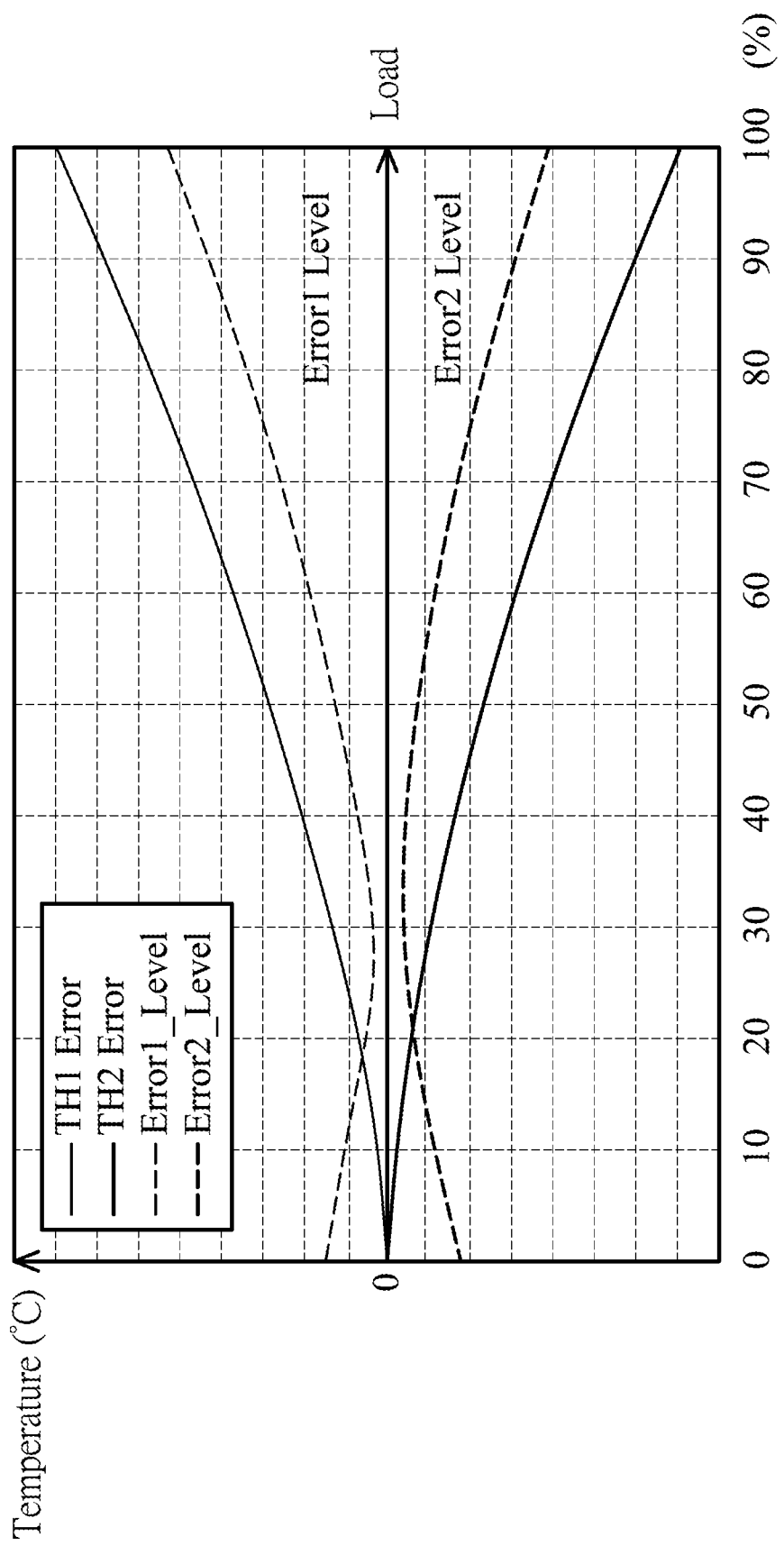
FIG. 4 is a graph illustrating a relationship between the thermal abnormality determination value and the system load, together with a variation error threshold value according to yet another embodiment of the present invention.

Next, yet another embodiment of the present invention will be described. FIG. 4 is a graph illustrating a relationship between the thermal abnormality determination value and the system load, together with a variation error threshold value according to yet another embodiment of the present invention. Referring to FIG. 4, if the error threshold value is further corrected, it means that the error threshold values Error1_Level and Error2_Level become dynamic threshold values that change with the load. These two dynamic threshold values can be defined by the error between the model represented by the estimated temperature calculation formula and the actual temperature model. The load (LOAD) is not limited to a single variable, but can also be multivariable, which is often related to the loss. If the condition of load is multivariable, FIG. 4 will become a polysurface.

Since the error of the model represented by the temperature calculation formula and the actual temperature model will vary with the load, when the temperature calculation model is established, a minimum error threshold value may be adjusted through experiments to locate in a certain set load range. As the load deviates from the set load, the error threshold value will increase, but this error threshold value needs to be set lower than the value indicating that the heat dissipation system is abnormal when the load increases, that is, Error1_Level<TH1 Error and Error2_Level<TH2 Error to ensure that the heat dissipation of the system can be detected.

The advantage of this setting is that, besides the advantage of simplifying the model as in the previous embodiment, the load level for determining whether the heat dissipation system is abnormal can be changed by adjusting Error1_Level and Error2_Level. In the embodiment of FIG. 3, the fixed value of Error1_Level can detect the thermal abnormality of the heat dissipation system 10 when the load is more than 25%, and the fixed value of Error2_Level can detect the thermal abnormality of the heat dissipation system 20 when the load is more than 30%. However, if the error threshold value is changed to a dynamic value, taking this embodiment and FIG. 4 as an example, the minimum load where the thermal abnormality of the heat dissipation system 10 can be detected is reduced from 25% to 18%, and the minimum load where the thermal abnormality of the heat dissipation system 20 can be detected is reduced from 30% to 22%. As can be seen from the above embodiments, the minimum load where the thermal abnormality can be detected will vary depending on how the temperature calculation model is established.

Therefore, for this embodiment, the above judgment formula group (a)-(d) can be rewritten as follows: When the formula (i) is satisfied, the heat dissipation system 10 is abnormal; when the formula (j) is satisfied, the heat dissipation system 20 is abnormal; when the formula (k) is satisfied, the heat dissipation system 10 is abnormal or both the heat dissipation systems 10 and 20 are abnormal; when the formula (l) is satisfied, the heat dissipation system 20 is abnormal or both the heat dissipation systems 10 and 20 are abnormal; and if neither formula (i)-(l) is satisfied, it is determined that the two heat dissipation systems 10 and 20 are normal.

$$dTH1-dTH2>\text{Error1\_Level} \qquad (i)$$

$$dTH1-dTH2<\text{Error2\_Level} \qquad (j)$$

$$TH1>TH1\_cal\_limt \qquad (k)$$

$$TH2>TH2\_cal\_limt \qquad (l)$$

Error1_Level and Error2_Level are variation values.

Similarly, the above four judgment formulas (i)-(l) can be further simplified as follows by the above formula (10): When the formula (i') is satisfied, the heat dissipation system 10 is abnormal; when the formula (j') is satisfied, the heat dissipation system 20 is abnormal; when the formula (k') is satisfied, the heat dissipation system 10 is abnormal or both the heat dissipation systems 10 and 20 are abnormal; when the formula (l') is satisfied, the heat dissipation system 20 is abnormal or both the heat dissipation systems 10 and 20 are abnormal; and if neither formula (i')-(l') is satisfied, it is determined that the two heat dissipation systems 10 and 20 are normal.

$$d1-d2>\text{Error1\_Level} \qquad (i')$$

$$d1-d2<\text{Error2\_Level} \qquad (k')$$

$$d1>0 \qquad (k')$$

$$d2>0 \qquad (l')$$

Error1_Level and Error2_Level are variation values.

Figure 5:
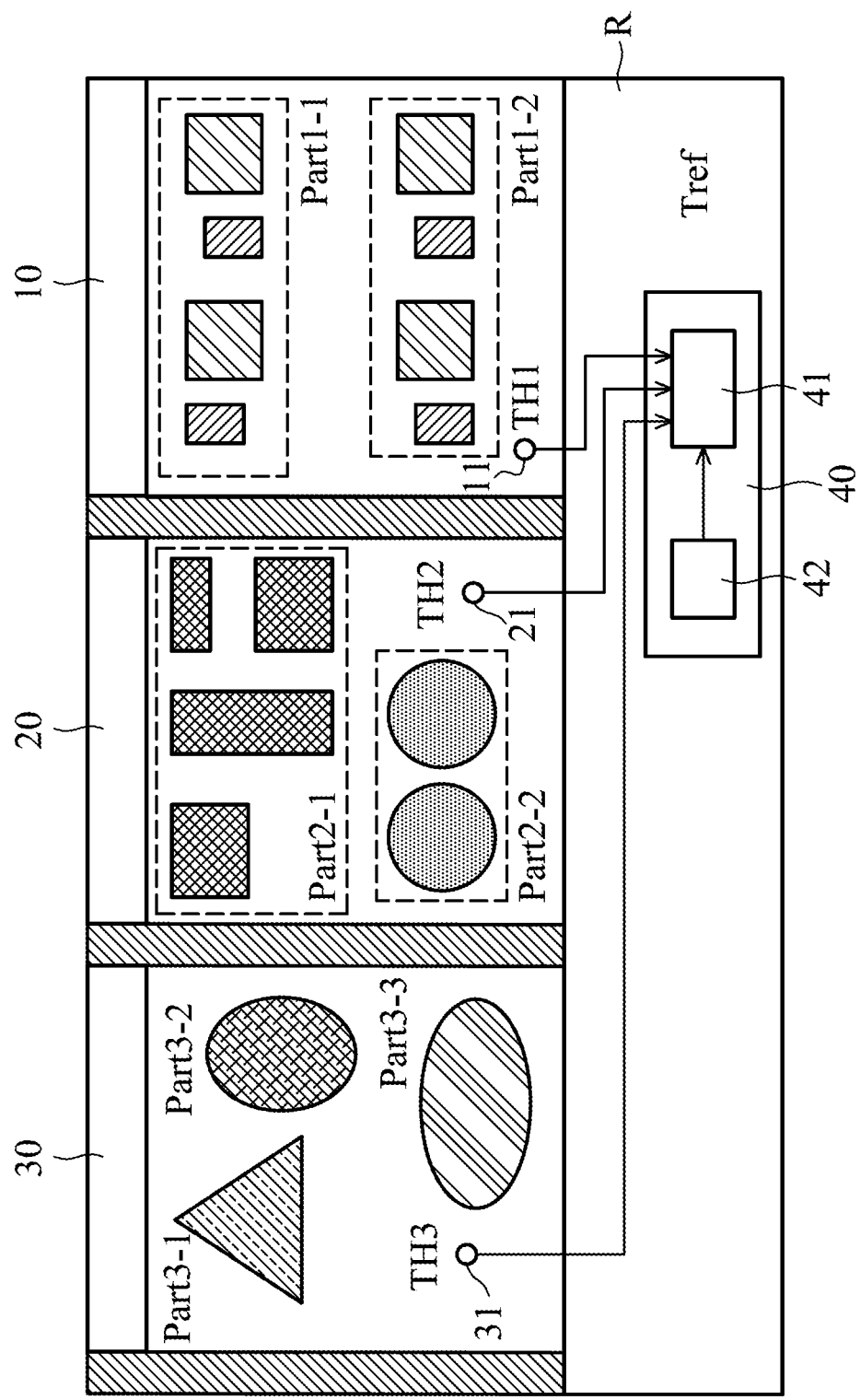
FIG. 5 is a schematic diagram of a thermal abnormality detection architecture of three heat dissipation systems according to an embodiment of the present invention.

The above embodiment is exemplified by the detection of thermal abnormality of two heat dissipation systems. Of course, the present invention can also be applied to three or more heat dissipation systems. FIG. 5 is a schematic diagram of a thermal abnormality detection architecture of three heat dissipation systems according to an embodiment of the present invention. As shown in FIG. 5, in addition to the two heat dissipation systems 10 and 20 shown in FIG. 1, FIG. 5 further adds another heat dissipation system 30, which has parts Part 3-1, Part 3-2, Part 3-3. A third temperature sensor 31 is provided to measure the actual temperature TH3 in the heat dissipation system 30. At least one of the parts Part3-1, Part3-2, and Part 3-3 may be a heat source. Except that the heat dissipation system 30 is added, the rest of the configuration is the same as in FIG. 1.

Since there are a total of three heat dissipation systems 10, 20, and 30, if any two heat dissipation systems of them are taken out to perform the above-described thermal abnormality judgment formula, three groups (i.e., 12 total) of judgment formulas will be obtained accordingly. It is assumed that fixed error threshold values Error1_Level, Error2_Level, and Error3_Level are employed, and the above three error threshold values are all expressed as positive values. The following judgment formulas for the heat dissipation system 10 and the heat dissipation system 20 can be obtained: When the formula (e12) is satisfied, the heat dissipation system 10 is abnormal; when the formula (f12) is satisfied, the heat dissipation system 20 is abnormal; when the formula (g12) is satisfied, the heat dissipation system 10 is abnormal or both the heat dissipation systems 10 and 20 are abnormal; and when the formula (h12) is satisfied, the heat dissipation system 20 is abnormal or both the heat dissipation systems 10 and 20 are abnormal.

$$dTH1+dTH2>\text{Error1\_Level} \qquad (e12)$$

$$dTH1-dTH2<-\text{Error2\_Level} \qquad (f12)$$

$$TH1>TH1\_cal\_limt \qquad (g12)$$

$$TH2>TH2\_cal\_limt \qquad (h12)$$

The following judgment formulas for the heat dissipation system 20 and the heat dissipation system 30 can be obtained: When the formula (e23) is satisfied, the heat dissipation system 20 is abnormal; when the formula (f23) is satisfied, the heat dissipation system 30 is abnormal; when the formula (g23) is satisfied, the heat dissipation system 20 is abnormal or both the heat dissipation systems 20 and 30 are abnormal; and when the formula (h23) is satisfied, the heat dissipation system 30 is abnormal or both the heat dissipation system 20 and 30 are abnormal.

$$dTH2-dTH3>\text{Error2\_Level} \qquad (e23)$$

$$dTH2-dTH3<-\text{Error3\_Level} \qquad (f23)$$

$$TH2>TH2\_cal\_limt \qquad (g23)$$

$$TH3>TH3\_cal\_limt \qquad (h23)$$

The following judgment formulas for the heat dissipation system 10 and the heat dissipation system 30 can be obtained: When the formula (e13) is satisfied, the heat dissipation system 10 is abnormal; when the formula (f13) is satisfied, the heat dissipation system 30 is abnormal; when the formula (g13) is satisfied, the heat dissipation system 10 is abnormal or both the heat dissipation systems 10 and 30 are abnormal; and when the formula (h13) is satisfied, the heat dissipation system 30 is abnormal or both the heat dissipation system 10 and 30 are abnormal.

$$dTH1-dTH3>\text{Error1\_Level} \qquad (e13)$$

$$dTH1-dTH3<-\text{Error3\_Level} \qquad (f13)$$

$$TH1>TH1\_cal\_limt \qquad (g13)$$

$$TH3>TH3\_cal\_limt \qquad (h13)$$

According to this embodiment, whether the three heat dissipation systems are abnormal or not can be actually determined by using only two sets of judgment formulas. Therefore, if more than three heat dissipation systems are adapted, more judgments can be made to determine whether the heat dissipation system is abnormal, and it is easier to determine which dissipation system is normal and which dissipation system is abnormal.

The following describes an example in which the thermal abnormality of the two heat dissipation systems is determined using the fixed error threshold values shown in FIG. 3. For the two heat dissipation systems 10 and 20, the temperature calculation formulas corresponding to the two heat dissipation systems 10 and 20 are used first, and the reference temperature upper limit value Tref_limit is substituted for the upper temperature limit of the two heat dissipation systems 10 and 20. Next, fixed error threshold values are set. Error1_Level is set to 10 and Error2_Level is set to −10, that is, Error1_level and Error1_level2 are set to fixed positive and negative values that are opposite to each other.

Table 1 shows the actual temperature and the upper temperature limit of the heat dissipation systems 10 and 20 under three different conditions.

TABLE 1

| Condition | Load | TH1(° C.) | TH2(° C.) | TH1_cal_limt(° C.) | TH2_cal_limt(° C.) |
|---|---|---|---|---|---|
| 1 | 98% | 66.3 | 32.9 | 86.9 | 57.6 |
| 2 | 57% | 73.5 | 33.5 | 72.7 | 53.7 |
| 3 | 60% | 50.1 | 45.8 | 73.7 | 53.8 |

Since the upper limit temperatures of the heat dissipation systems 10 and 20 are calculated in Table 1, the formulas (e')-(h') with the fixed error threshold value corresponding to FIG. 3 of the present invention can be directly applied.

Under the condition 1, d1 is the difference between the actual temperature TH1 of the heat dissipation system 10 and the upper limit temperature TH1_cal_limit of the heat dissipation system 10, so d1=66.3−86.9=−20.6, and d2 is the difference between the actual temperature TH2 of the heat dissipation system 20 and the upper limit temperature TH2_cal_limit of the heat dissipation system 20, and therefore d2=32.9−57.6=−24.7. Therefore the difference value of d1−d2=−20.6−(−24.7)=4.1, and is between the pre-set values 10 and −10. In addition, the actual temperatures of the heat dissipation system 10 and the heat dissipation system 20 do not reach their upper limit temperatures TH1_cal_limit and TH2_cal_limit, that is, both d1 and d2 are less than zero. The heat dissipation systems 10 and 20 under the condition 1 do not satisfy any one of the formulas (e')-(h'). The heat dissipation systems 10 and 20 are normal.

Under the condition 2, d1=73.5−72.7=0.8 and d2=33.5−53.7=−20.2. Therefore the difference value of d1−d2=0.8−(−20.2)=21.1, and exceeds the pre-set value 10. In addition, the actual temperature of the heat dissipation system 10 exceeds the upper limit temperature TH1_cal_limit, that is, d1 is greater than zero. Since the heat dissipation systems 10 and 20 under the condition 2 satisfy the judgment formulas (i') and (k'), respectively, it is determined that the heat dissipation system 10 is abnormal.

Under the condition 3, d1=50.1−73.7=−23.6 and d2=45.8−53.8=−8.0. Therefore the difference value of d1−d2=−23.6−(−8.0)=−15.5 and is lower than the pre-set value −10. In addition, the actual temperatures of the heat dissipation system 10 and the heat dissipation system 20 do not reach their upper limit temperatures TH1_cal_limit and TH2_cal_limit, that is, both d1 and d2 are less than zero. Since both the heat dissipation systems 10 and 20 under the condition 3 satisfy the judgment formulas (j'), it is determined that the heat dissipation system 20 is abnormal.

In the present invention, with estimated temperature calculation formulas, the temperature sensors of the heat dissipation systems, and the judgment formulas, a plurality of heat dissipation systems can be judged instantly whether there is thermal abnormality, without increasing amount of the temperature sensors for detecting the reference temperature. There is no need to use heat-dissipating components with feedback circuits such as fans and cooling systems. Therefore, the present invention can simplify the component configuration and significantly reduce the cost.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermal abnormality detection system, comprising:
a first heat dissipation system having a first temperature sensor for measuring an actual temperature of the first heat dissipation system;
a second heat dissipation system having a second temperature sensor for measuring an actual temperature of the second heat dissipation system; and
a calculation unit using a preset reference temperature and a first estimated temperature calculation formula that conforms to the first heat dissipation system to calculate an upper limit temperature of the first heat dissipation system, and using the preset reference temperature and a second estimated temperature calculation formula that conforms to the second heat dissipation system to calculate an upper limit temperature of the second heat dissipation system,
wherein it is assumed that a difference between the actual temperature of the first heat dissipation system and the upper limit temperature of the first heat dissipation system is d1, and a difference between the actual temperature of the second heat dissipation system and the upper limit temperature of the second heat dissipation system is d2, when a value of d1−d2 is greater than an error threshold value Error1_level, the first heat dissipation system is determined to be abnormal, and when the value of d1−d2 is less than an error threshold value Error2_level, the second heat dissipation system is determined to be abnormal.

2. The thermal abnormality detection system as claimed in claim 1, wherein when d1 is greater than 0, it indicates that the first heat dissipation system is abnormal or both the first heat dissipation system and the second heat dissipation system are abnormal,
when d2 is greater than 0, it indicates that the second heat dissipation system is abnormal or both the first heat dissipation system and the second heat dissipation system are abnormal, and
when both d1 and d2 are less than or equal to 0, it indicates that the first heat dissipation system and the second heat dissipation system are normal.

3. The thermal abnormality detection system as claimed in claim 2, wherein both Error1_level and Error2_level are 0.

4. The thermal abnormality detection system as claimed in claim 2, wherein Error1_level is a positive fixed value, and Error2_level is a negative fixed value.

5. The thermal abnormality detection system as claimed in claim 2, wherein Error1_level is a positive variation value corresponding to a load, and Error1_level2 is a negative variation value corresponding to the load.

6. The thermal abnormality detection system as claimed in claim 1, wherein both Error1_level and Error2_level are 0.

7. The thermal abnormality detection system as claimed in claim 1, wherein Error1_level is a positive fixed value, and Error2_level is a negative fixed value.

8. The thermal abnormality detection system as claimed in claim 1, wherein Error1_level is a positive variation value corresponding to a load, and Error1_level2 is a negative variation value corresponding to the load.

9. The thermal abnormality detection system as claimed in claim 1, further comprising:
   a memory unit for storing the reference temperature, the first estimated temperature calculation formula, the second estimated temperature calculation formula, the error threshold value Error1_level, and the error threshold value Error2_level.

10. A thermal abnormality detection method for determining whether a first heat dissipation system or a second heat dissipation system is abnormal, the method comprising steps of:
   measuring an actual temperature of the first heat dissipation system;
   measuring an actual temperature of the second heat dissipation system;
   setting a reference temperature;
   substituting the reference temperature into a first estimated temperature calculation formula that conforms to the first heat dissipation system to calculate an upper limit temperature of the first heat dissipation system;
   substituting the reference temperature into a second estimated temperature calculation formula that conforms to the second heat dissipation system to calculate an upper limit temperature of the second heat dissipation system;
   setting an error threshold value Error1_level of the first heat dissipation system;
   setting an error threshold value Error2_level of the second heat dissipation system; and
   assuming that the difference between the actual temperature of the first heat dissipation system and the upper limit temperature of the first heat dissipation system is d1, and a difference between the actual temperature of the second heat dissipation system and the upper limit temperature of the second heat dissipation system is d2, when a value of d1−d2 is greater than the error threshold value Error1_level, the first heat dissipation system is determined to be abnormal, and when the value of d1−d2 is less than the error threshold value Error2_level, the second heat dissipation system is determined to be abnormal.

11. The thermal abnormality detection method as claimed in claim 10, further comprising steps of:
   when d1 is greater than 0, determining that the first heat dissipation system is abnormal or both the first heat dissipation system and the second heat dissipation system are abnormal,
   when d2 is greater than 0, determining that the second heat dissipation system is abnormal or both the first heat dissipation system and the second heat dissipation system are abnormal, and
   when both d1 and d2 are less than or equal to 0, determining that the first heat dissipation system and the second heat dissipation system are normal.

12. The thermal abnormality detection method as claimed in claim 11, wherein both Error1_level and Error2_level are 0.

13. The thermal abnormality detection method as claimed in claim 11, wherein Error1_level is a positive fixed value, and Error2_level is a negative fixed value.

14. The thermal abnormality detection method as claimed in claim 11, wherein Error1_level is a positive variation value corresponding to a load, and Error1_level2 is a negative variation value corresponding to the load.

15. The thermal abnormality detection method as claimed in claim 10, wherein both Error1_level and Error2_level are 0.

16. The thermal abnormality detection method as claimed in claim 10, wherein Error1_level is a positive fixed value, and Error2_level is a negative fixed value.

17. The thermal abnormality detection method as claimed in claim 10, wherein Error1_level is a positive variation value corresponding to a load, and Error1_level2 is a negative variation value corresponding to the load.

* * * * *